United States Patent [19]

Garber

[11] Patent Number: 4,591,406
[45] Date of Patent: May 27, 1986

[54] AUTOMATIC LAMINATOR WITH INTEGRATED PRINTER BUFFER/INTERFACE

[75] Inventor: John L. Garber, Fenton, Mo.

[73] Assignee: Dynachem Corporation, Tustin, Calif.

[21] Appl. No.: 695,018

[22] Filed: Jan. 25, 1985

[51] Int. Cl.$^4$ .............................................. B32B 31/20
[52] U.S. Cl. ...................................... 156/484; 156/538
[58] Field of Search ............... 156/484, 555, 552, 572, 156/538

[56] References Cited

U.S. PATENT DOCUMENTS 4,338,152  7/1982  Del Bianco ...................... 156/552 X
4,464,221  8/1984  Garber ............................. 156/555 X Primary Examiner—David Simmons
Attorney, Agent, or Firm—Gerald K. White

[57] ABSTRACT

An automatic system that feeds, laminates, unloads, stores and transfers laminated panels to subsequent processing for use in the electronics industry includes an automatic laminator that operates with a single roll of photoresist dry film to effect single wrap around lamination of each of a plurality of panels in succession and removal of the polyethylene protective cover sheet, and further includes a buffer/interface unit that is operative during a post lamination period to provide a holding area for the laminated panels to allow them to chemically stabilize prior to imaging, and in addition, is operative after the panel has stabilized to translate each of the panels, in turn, from a vertical to a horizontal position and deliver it to the infeed portion of an exposure machine that is mated with it.

15 Claims, 28 Drawing Figures

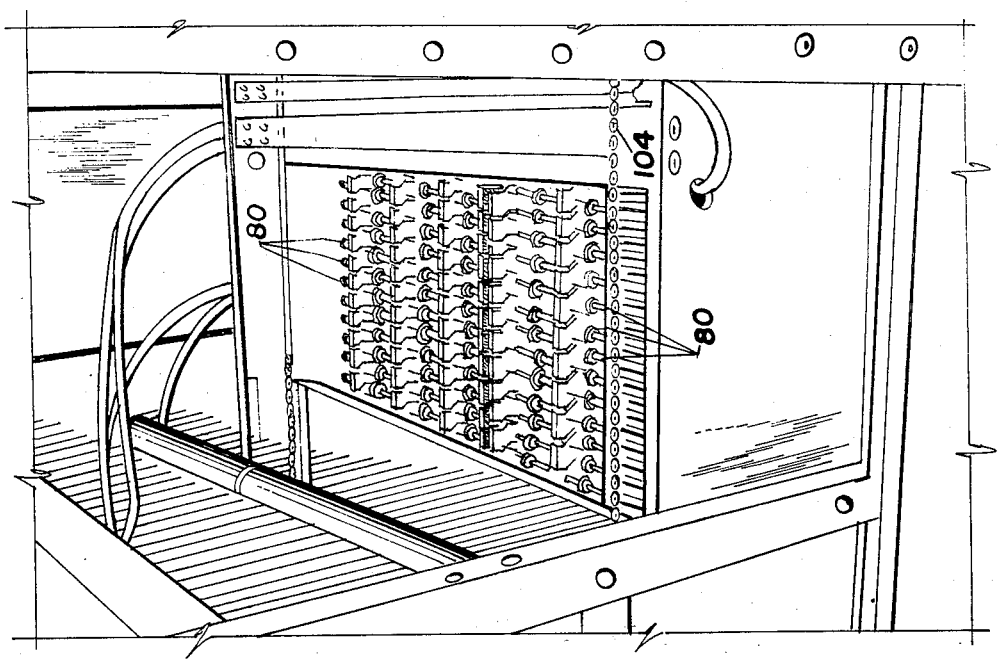
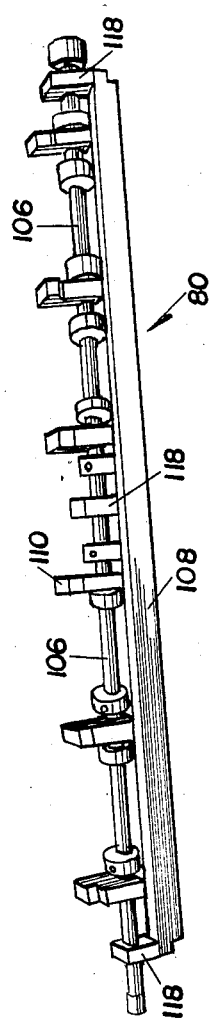
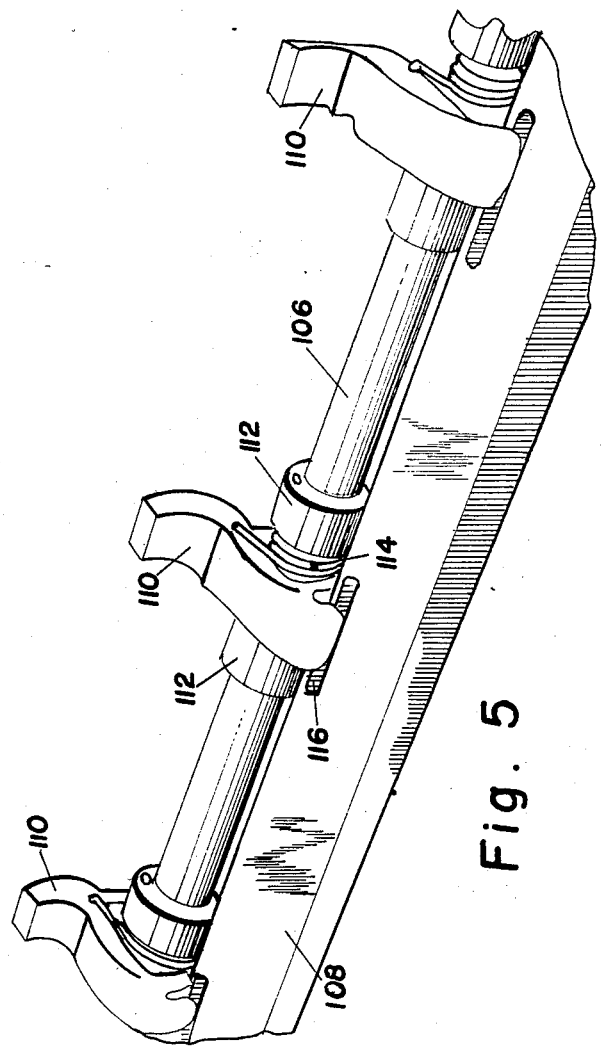

AUTOMATIC LAMINATOR WITH INTEGRATED PRINTER BUFFER/INTERFACE

BACKGROUND OF THE INVENTION

1. Field of the Invention

The present invention is directed to the manufacture of printed circuit boards and panels that are used in the electronics industry, and more particularly, to an automatic system that feeds, laminates, unloads, stores and transfers laminated panels to subsequent systems for further processing.

2. Description of the Prior Art

Automatic laminators for securing sheets of photopolymer dry film simultaneously to the opposite sides of a succession of panels are known in the prior art. Thus, in my prior U.S. Pat. No. 4,464,221 granted on Aug. 7, 1984, there is disclosed an automatic laminator for laminating photopolymer resist dry film onto each of a succession of printed circuit boards or panels. The laminator operates with a single roll of photoresist dry film to effect single sheet wrap around lamination of each of the panels and removal of the polyethylene cover sheet that is provided for protecting and facilitating the handling of the photoresist dry film. Following such lamination, the panels are delivered to a panel stacker and arranged in an upright lean-to fashion for cooling and chemical stabilization or setting.

It has been the practice following such lamination to transfer the panels manually to a subsequent system, for example, an exposure unit, for imaging. Such manual handling of the laminated panels not only adds to the cost of manufacture but subjects the panels to risk of contamination.

There is thus a need and a demand to provide an automatically operative unit or system that not only feeds and laminates each of a succession of panels, in turn, but which also, during a post lamination period for each of the panels in succession, automatically unloads, stores and transfers the panels to a subsequent system for further processing.

By reference herein, the disclosure of my prior U.S. Pat. No. 4,464,221 is made a part hereof.

SUMMARY OF THE INVENTION

An object of the invention is to provide for use with an automatic laminator a buffer interface unit to create a holding or storage area for the laminated panels to allow them to stabilize chemically prior to imaging.

Another object of the invention is to provide such a buffer interface unit that is automatically operative to take each of the stored panels after it has chemically stabilized and translate it from a vertical to horizontal position and deliver it to the infeed portion of a subsequent system, for example, exposure equipment that is mated with it.

In accomplishing these and other objectives of the present invention, the automatic laminator of my abovementioned prior patent has been modified slightly to accept the buffer interface unit. A first area of modification is in the laminated panel delivery section of the laminator. The delivery belts of the laminator function as they did previously. However, a second set of two additional belts are provided, also. These latter belts act as a loading stop for each panel as it exits the laminating nip and is delivered downwardly to a loading position for pick up by a waiting panel pickup or gripper bar and movement into a storage area for chemical stabilizing.

Other modifications include the provision of additional solenoid valves to actuate the additional pneumatic cylinders that are required, specifically a gripper bar loading cylinder, a gripper bar transfer-to-load cylinder, and a loading position belt actuating cylinder. The programmable controller provided in the automatic laminator has an expandable IO (Input/Output) Rack to accommodate the additional circuitry that is needed to operate the buffer interface.

In an operative embodiment of the invention, the holding or storage area, which may also be termed a magazine area, normally carries 41 panels. When a panel is placed in the storage area by the gripper loading cylinders, the panel in the most advanced position in the storage area is transferred to a delivery chain and subsequently is translated from a vertical to a horizontal position and delivered on to a panel delivery or exit belt that carries the panel on to the table of an exposure unit that is mated to the buffer interface.

As those skilled in the art will understand, the buffer interface unit, including the magazine area which serves as the storage area and the delivery section that translates the panel from a vertical to a horizontal position to deliver it to the associated exposure equipment, has the potential of a stand alone system.

BRIEF DESCRIPTION OF THE DRAWINGS

Having summarized the invention, a detailed description follows with reference being made to the accompanying drawings which form part of the specification, of which:

FIG. 4 is a rear view of a complete gripper bar and shows it as comprising a cylindrical bar having an attached centrally located shorter rectangular bar with grippers mounted on the cylindrical bar and biased into engagement with the rectangular bar for clamping the edge of a panel therebetween;

FIG. 5 is a view, on a larger scale, of a portion of a gripper bar showing a nylon gripper, an inserted urethane pad, a helical tension spring, and locating collars;

FIG. 12 is a front view of the storage magazine showing the gripper bars in the normal spacing relation thereof;

DESCRIPTION OF THE PREFERRED EMBODIMENT

Figure 1:
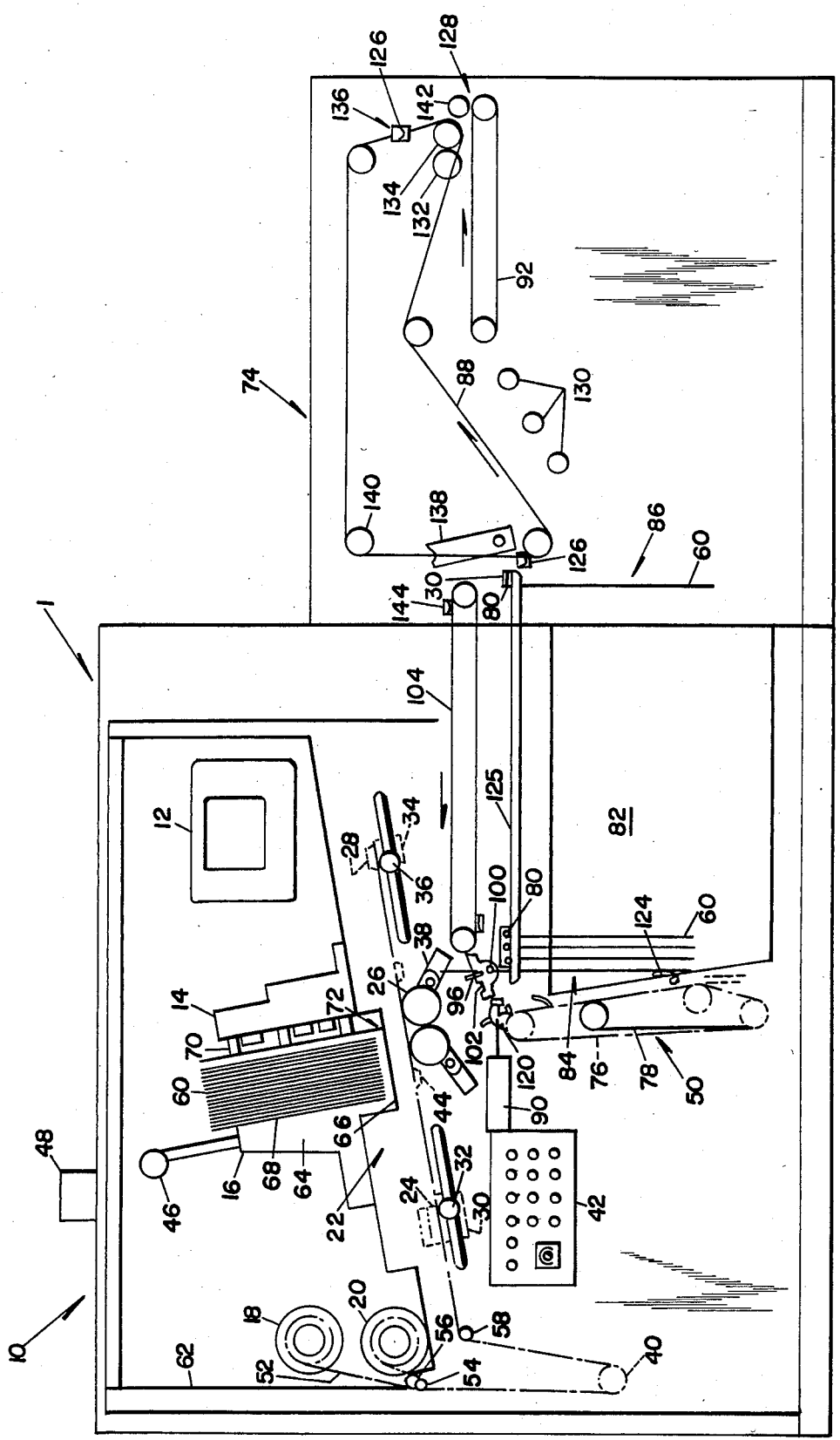
FIG. 1 is a schematic illustration of an automatically operative unit, according to the invention, comprising an automatic laminator with an integrated buffer/interface.

In FIG. 1 there is shown an automatically operative unit, generally designated by a reference numeral 1, that comprises an automatic laminator and an associated integrated printer buffer/interface.

The automatic laminator is indicated by the numeral 10 and may be identical to the automatic laminator disclosed in my aforementioned patent except, as mentioned hereinbefore, for modification of the laminated panel delivery unit. Thus, the laminator 10 includes a CRT graphic display unit 12, a panel pick-up unit 14, a panel load-pile feed unit 16, a photoresist dry film unwind supply roll 18, and a polyethylene or polyester film take-up roll 20. The laminator 10 further includes a laminating station 22 at the left end of which a dry film cutoff knife 24 is provided. At the laminating station 22 there is further provided a pair of heated laminating rolls 26, a vacuum film feed bar 28, a left film length adjust vacuum bar 30, a left film length adjust knob 32, a right film length adjust vacuum bar 34, a right film length adjust knob 36, and intensified IR (infra red) lamps 38. Additionally, the laminator 10 includes a film loop dancer control 40, a control panel 42, a vacuum film tension bar 44, an air exhaust 46, an exhaust duct 48, and an exit delivery belt unit 50.

As may be seen by reference to FIG. 1, photoresist dry film 52 is unwound from the film supply roll 18 and drawn down over a guide roll 54. At the guide roll 54, a protective polyethylene cover 56 is separated from the dry film 52 and is directed upwardly to be wound on the take-up roll 20. The dry film 52 continues in a downward path to and around the dancer control 40. From the dancer control 40, the dry film 52 is continued upwardly and over a guide roll 58 to the left film length adjustment vacuum bar 30 from where the film 52 is shown as having been drawn or extended through the laminating station 22, terminating at the vacuum film feed bar 28. When so extended, the film 52 is in proper position to be cut by cutoff knife 24 and laminated on a panel or board 60.

In an operative embodiment, the automatic laminator 10 is contained within a housing or supporting frame, designated by reference numeral 62, which may be made of aluminum plate or other suitable material. The laminator 10 accommodates panels or boards 60 in sizes from 24"×24" (609×609 mm.) to 10"×10" (254×254 mm.) having a thickness ranging from 0.032" to 0.125" (0.81 to 3.18 mm.), and has a capacity for cycling 100 panels of 0.062" (16 mm.) per load. Typically, such panels 60 are made of copper.

The panel load-pile feed unit 16 comprises a generally reverse L-shaped member 64 that is positioned for forward and aft movement or activation on a flat surface or table 66. A transversely adjustable edge guide (not shown) is provided for accommodating panels 60 of different width. The L-shaped member 64 includes an upwardly directed backing plate 68 for supporting a load of panels 60 to be laminated. The surface of the backing plate 68 is slanted at an angle of approximately 10 degrees counterclockwise from the vertical direction, as shown in FIG. 1, so that the panels 60 will stay stably in place, as stacked, until picked up by the pick-up unit 14.

As the panels 60 are picked up by the pick-up unit 14, the member 64 is moved in incremental steps to the right to advance each of the successive panels 60 into position to be picked up.

The pick-up unit 14 comprises a plurality of vacuum cups or suckers, indicated at 70, that are carried at the ends of transverse vertically spaced pneumatic cylinder driven arms or bars (not shown). The latter arms or bars are moved alternately to the left and right. This causes the plurality of vacuum cups 70 to reach out into engagement with the surface of the immediately adjacent panel 60 in the stack in the panel load-pile feed unit 16 to bring the panel 60 with the lower edge thereof above a lamination nip indicated at 72. Immediately thereafter, in the cycle of operation, the panel pick-up unit 14 is actuated downwardly to move the panel 60 that has been picked up down into the lamination nip 72 and between the laminating rolls 26.

An IR lamp controller (not shown) controls the energization of the IR lamps 38 as required to maintain the temperature of the laminating rolls 26 at a predetermined value, typically 250° F. The response of the temperature sensing means and the lamp controller is very fast whereby the temperature of the laminating rolls 26 is maintained precisely at the desired value.

As the panel pick-up unit 14 is actuated downwardly to move the panel 60 down through the laminator nip 72 and through the lamination rolls 26, the lower edge of the panel 60 engages the photoresist dry film 52, and pulling the film 52 downwardly, folds or wraps it into engagement with the opposite sides of the panel 60. The heated lamination rolls 26 heat the film 52 and press it into tight engagement with the opposite sides of the panel 60 thereby providing a laminated structure. The laminated panel 60 is delivered to the laminator exit delivery belt unit 50. Upon release of the laminated panel 60 by the pick-up unit 14, the latter is returned to its upper position shown in FIG. 1 and the laminator 10 is restored to a condition wherein it is ready to effect the lamination of the next one of the panels 60 that are stacked in the panel load-pile unit 16.

Mated to the automatic laminator 10 is a buffer/interface unit 74. A primary function of buffer/interface unit 74 is to establish a holding area for the laminated panels 60 to enable them to become stabilized chemically prior to imaging. An ancillary purpose is to take each of the stored panels, in turn, after it has become stabilized, and translating it from a vertical to a horizontal position, to deliver it to the infeed portion of exposure or punching equipment that is mated with it.

The buffer/interface unit 74, as shown in FIG. 1, includes a plurality of panel gripper bars 80, a magazine storage area 82 having an infeed end or portion 84 and an output end or portion 86, the laminator exit delivery belt unit 50 being positioned adjacent the infeed portion 84, a delivery chain 88, a set of idler rollers 130, and a plurality of delivery or panel exit belts 92 associated with and positioned adjacent the output portion 86. Also positioned adjacent the infeed portion 84 of storage area 82 are two gripper bar loading pneumatic cylinders 90 and a plurality of return-to-load gripper bar transfer arms 96. Coupling the infeed portion 84 and output portion 86 of the storage area 82 is a gripper bar return chain 104. Positioned adjacent the output portion 86 is a plurality of gripper bar return-to-chain transfer arms 138. The buffer/interface unit 74 further includes a plurality of gripper bar opening devices or cams 132, as shown in FIGS. 13, 14 and 25-28.

As shown in FIGS. 1 and 7-9, the delivery belt unit 50 includes a first set of two spaced delivery belts 76, and in addition, a second set of two spaced delivery belts 78. The first set of delivery belts 76 function, as explained in my aforementioned prior patent, to lower each of the laminated panels 60, in succession, as it exits the nip of the laminating rolls 26. The second set of two belts 78 act as a loading position stop for each of the panels 60 and lower each of the panels to a gripper bar loading position where it is picked up by one of a plurality of gripper bars 80 and carried thereby into the magazine or storage area 82 of the buffer/interface unit 74.

In FIG. 1 three panels 60 are shown as having been put into the storage area 82 at the infeed portion 84 thereof and a single panel 60 is shown at the opposite or output end 86 of the storage area 82, the latter panel 60 being ready for transfer to the delivery chain 88 in the buffer/interface unit 74 for movement to and subsequent utilization in an imaging process.

Figure 16:
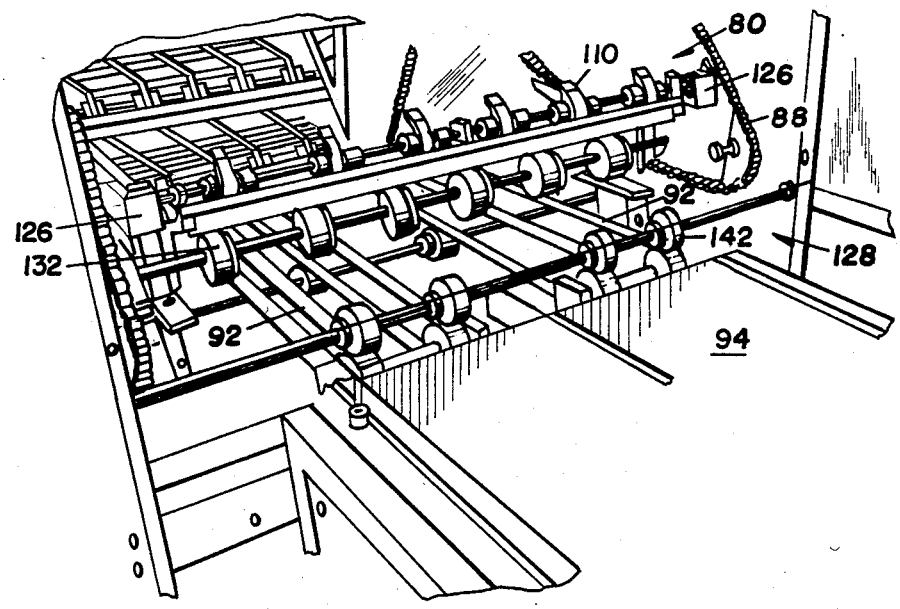
FIG. 16 is an angle view similar to that of FIG. 15 but with the gripper bar now shown in a "hold" position, and showing, also, the infeed table of an exposure unit.

In an operative embodiment of the invention, the storage area 82 is adapted to accommodate 41 panels at the same time. When a panel 60 is placed in the infeed end 84 of the storage area 82 by the gripper bar loading cylinders 90, the panel 60 in the storage area 82 at the output end 86 is transferred to the delivery chain 88. Subsequently, the latter panel 60 is translated from a vertical to a horizontal position and delivered on to the delivery belts 92. The delivery belts 92 carry the panel 60 and deposits it on an infeed table 94, as seen in FIG. 16, of an exposure unit that is mated to the buffer/interface unit 74.

Figure 2:
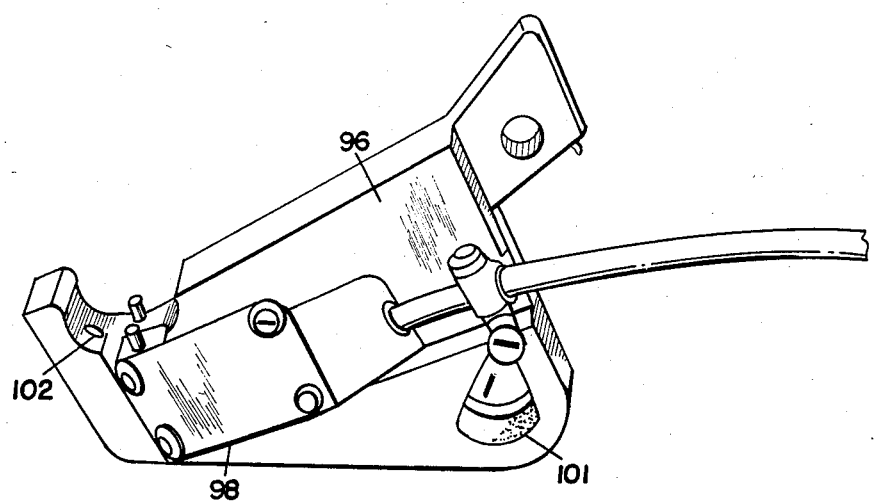
FIG. 2 is a view of a gripper bar return-to-load transfer arm with a sensor switch to detect a gripper bar after return.
Figure 3:
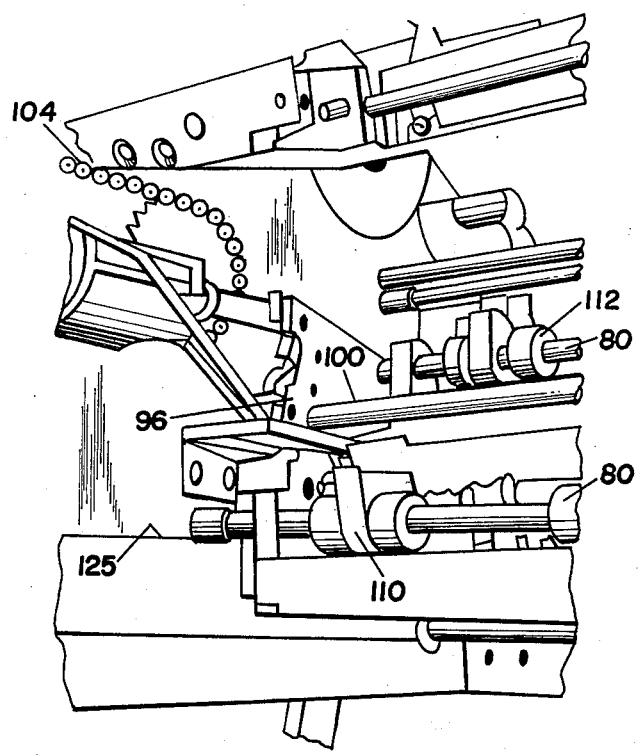
FIG. 3 is a view of the inside front plate of the buffer/interface showing the gripper bar return-to-load transfer arm with a first gripper bar in a pocket thereof, and showing, also, a second gripper bar in rack storage position #1 in the magazine storage area.
Figure 7:
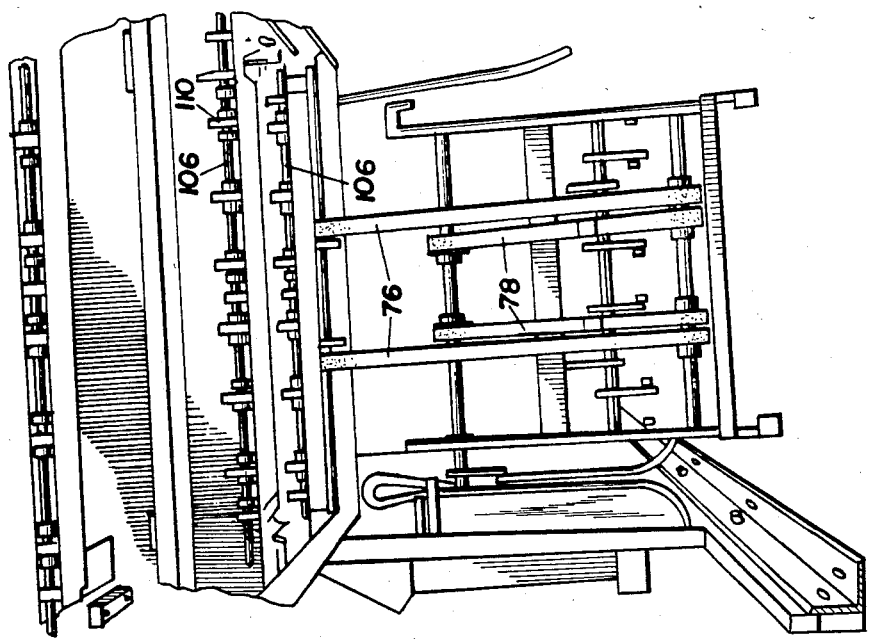
FIG. 7 is a view from the delivery end of the automatically operative unit with the gripper bars shown in the same position as in FIG. 6 and showing the laminator delivery belts and the buffer/interface loading position belts.

As shown in FIGS. 2 and 3, the gripper bar transfer-to-load transfer arm 96 includes a sensor switch 98 and is provided for transferring each of a plurality of gripper bars 80 in succession to a panel pick-up or loading position. Transfer arm 96 is pivoted at an opening 101 thereof for rotation on a shaft 100, being fixedly attached thereto, and is rotatable counterclockwise approximately 90 degrees to a vertical position from the position shown in FIG. 3.

When in the position shown in FIG. 3, transfer arm 96 is in position to receive, in a pocket 102 thereof, a gripper bar 80 that has been recycled by a gripper bar return chain 104 after having transported a panel 60 to the opposite and unloading end 86 of the buffer/interface unit 74 and released the panel thereat.

Figure 6:
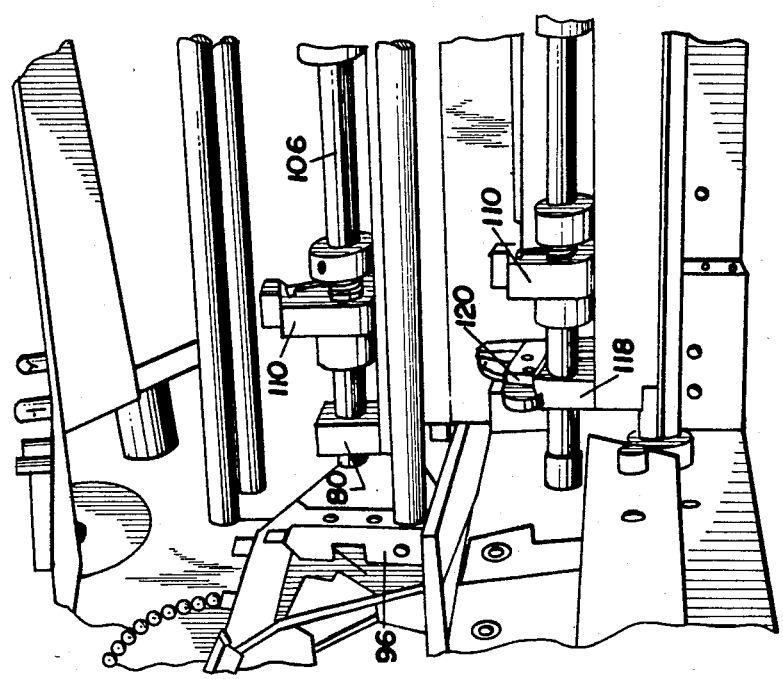
FIG. 6 is a view of the inside front plate of the buffer/interface showing the gripper bar return-to-load transfer arm with a first gripper bar positioned in a pocket thereof, and in addition, showing a second gripper bar in the grasp of a gripper bar loading cylinder holding claw or device.
Figure 9:
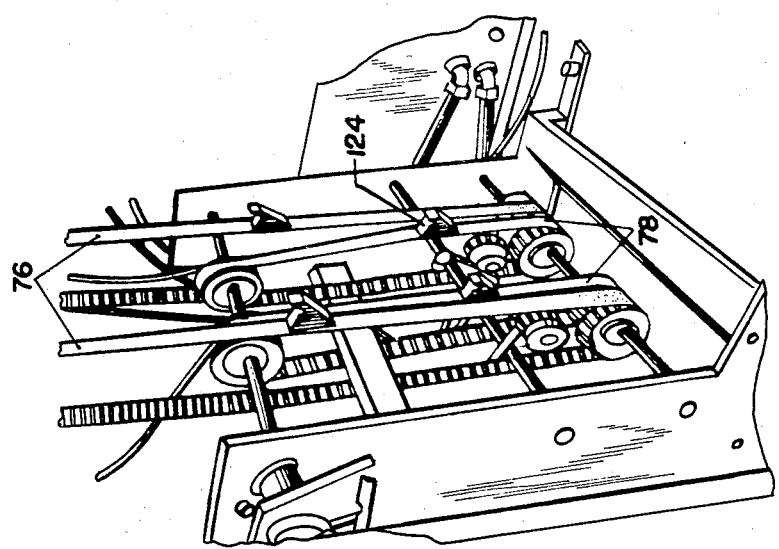
FIG. 9 is an angle view from the front of the unit through a lower opening showing the laminator delivery belts and the buffer/interface loading position belts in the delivery section.
Figure 8:
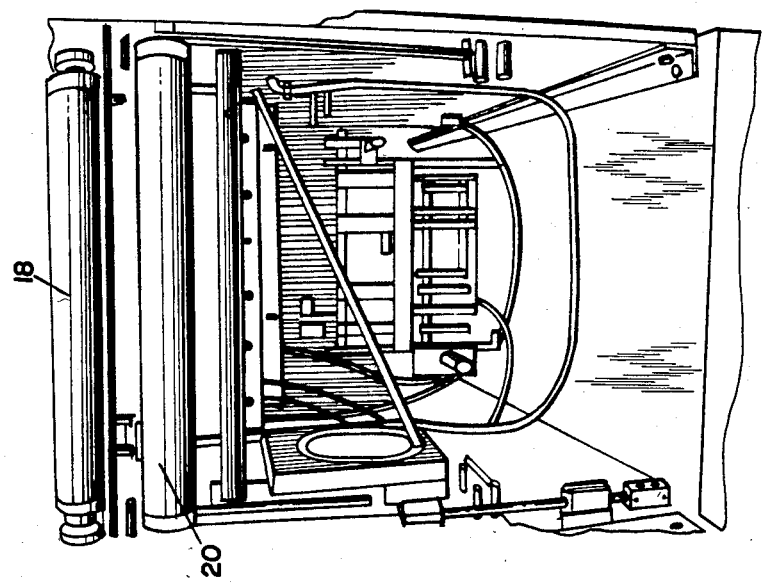
FIG. 8 is a view from the feeder end of the unit showing the laminated panel delivery section with a limit switch for the laminator delivery belts and an actuating cylinder for the loading position belts.

Rotation of the transfer arm 96 counterclockwise 90 degrees then places the gripper bar 80 in the pocket 102 thereof in a proper attitude for gripper bar loading. FIG. 6 shows the transfer arm 96 with a first gripper bar 80 in the pocket 102 of the transfer arm 96 and a second gripper bar 80 in rack storage position #1 in the storage area 82.

Detail views of a single gripper bar 80 are shown in FIGS. 4 and 5. Each gripper bar 80, as shown, includes a cylindrical rod 106 and a rectangular bar 108 that is somewhat shorter in length than rod 106 and is suitably attached by fasteners 118 at its ends to rod 106. A plurality of nylon grippers 110 are positioned in spaced relation along the length of rod 106, by locating collars 112. Each of the nylon grippers 110 is biased by a helical spring 114 for counterclockwise rotation into engagement with a respectively associated urethane pad 116 that is inserted in rectangular bar 108.

Figure 17:
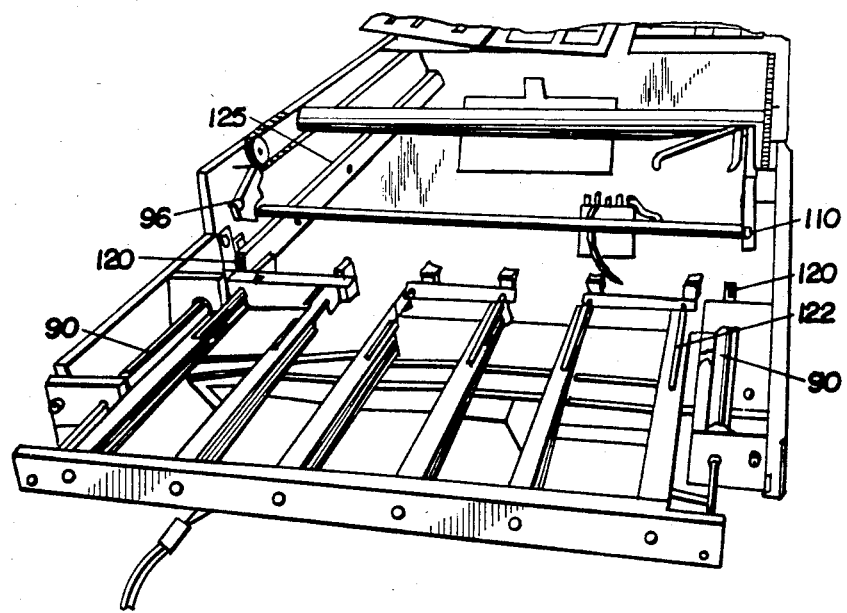
FIG. 17 is a view from the left end, at an angle from above, of a magazine storage area assembly, before installation in the supporting frame of the automatically operative unit, comprising a gripper bar recycling or return chain, gripper loading cylinders, and gripper opening cylinders.
Figure 18:
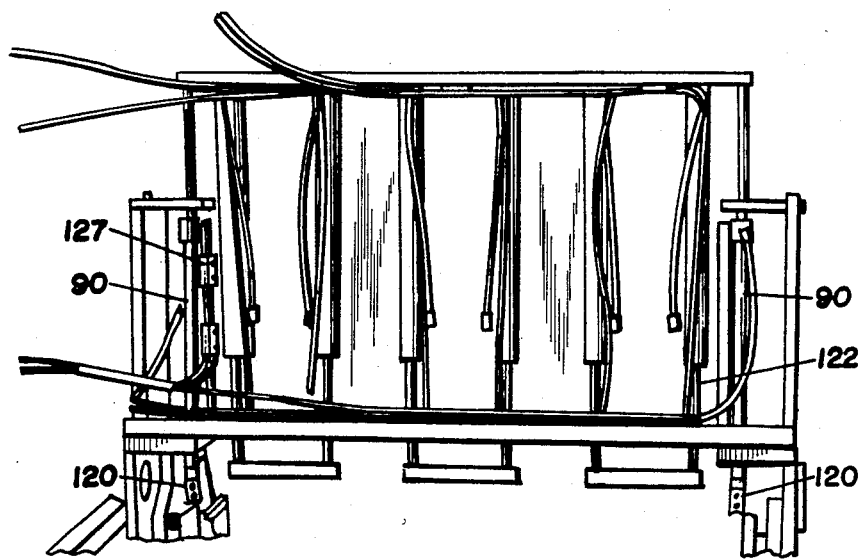
FIG. 18 is a view, from directly below, of the gripper loading cylinders and gripper opening cylinders of the assembly of FIG. 17.
Figure 19:
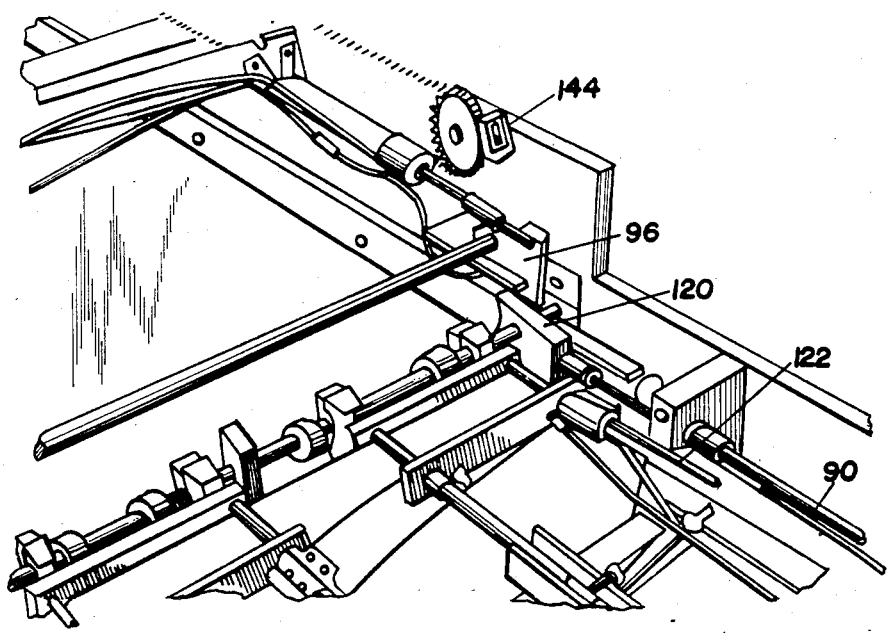
FIG. 19 is a view, from the right end and at an angle from above, of a portion of the assembly of FIG. 17 showing in greater detail the gripper bar return chain and the gripper opening cylinders.
Figure 20:
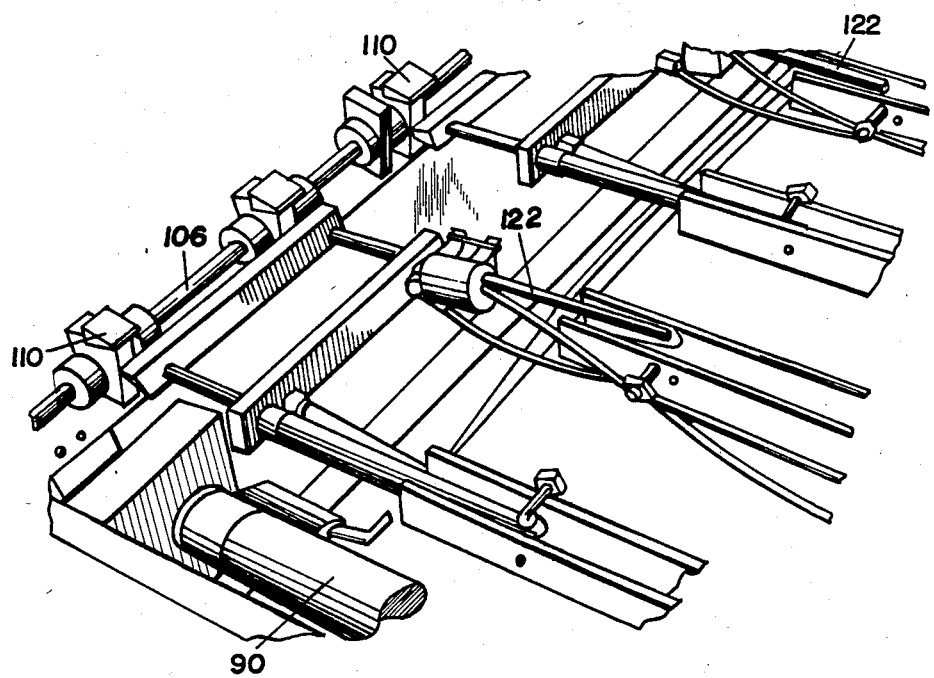
FIG. 20 is a view from the left end, at an angle from above, showing a gripper bar and the set of gripper bar opening cylinder structures in greater detail.
Figure 22:
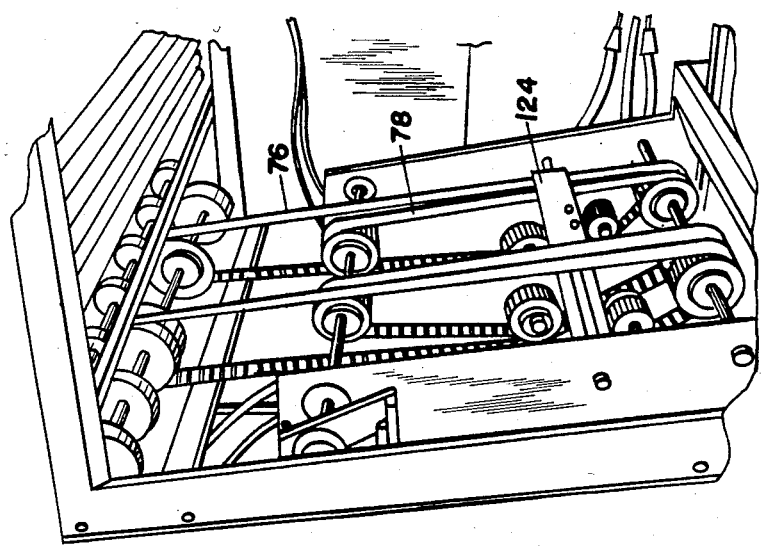
FIGS. 21 and 22 are views showing in greater detail the laminator delivery belts and the storage area loading positioning belts.
Figure 21:
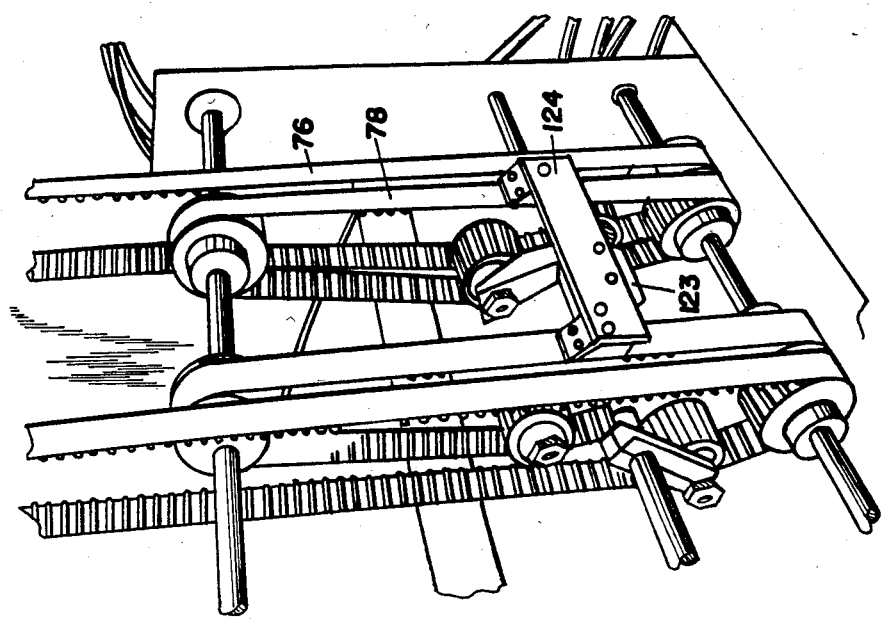
Figure 23:
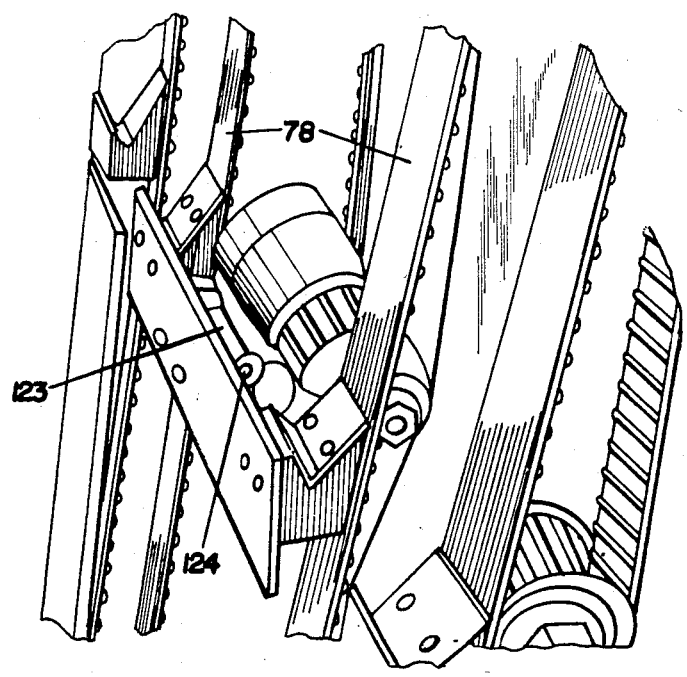
FIGS. 23 and 24 are views showing a sensor switch for detecting the lowering of a panel to a gripper bar loading position stop.
Figure 24:
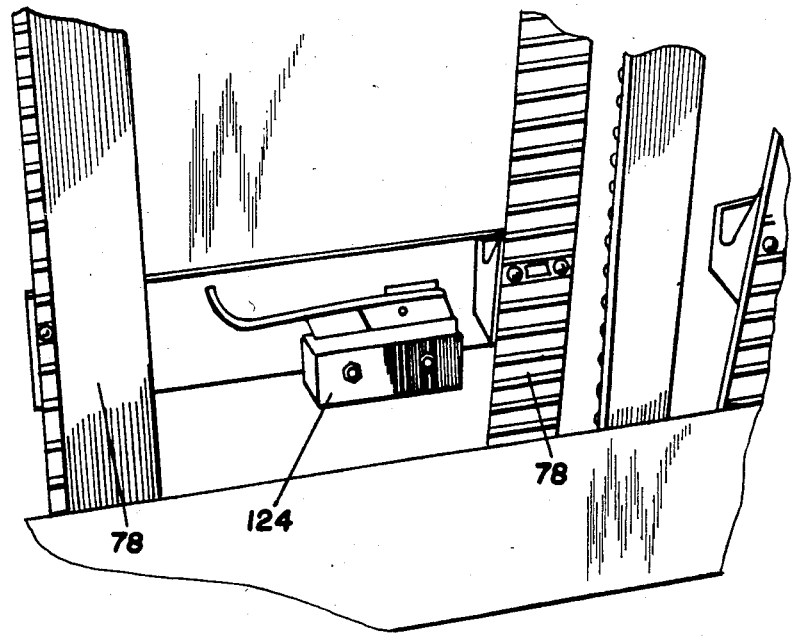

When a gripper bar 80 is in the pocket 102 of transfer arm 96 and is in proper attitude for loading, two cylinders 90, as best seen in FIGS. 1, 17 and 18 are moved forward to pick up the gripper bar 80 by a claw-like mechanism 120 on each of the ends of the cylinders 90. As soon as such pick up or attachment is effected, a set of gripper opening pneumatic cylinders 122, as shown in FIGS. 19 and 20, is actuated to rock or rotate each of the grippers 110 against the tension of its associated spring 114 to an open position thereof to allow the gripper bar 80 to accept a panel 60.

Upon passing through and exiting the laminating rolls 26 in the laminator 10, each laminated panel 60 is moved through a path that is at a 10 degree angle, approxmately, with the vertical, onto the first set of delivery belts 76. As the belts 76 proceed downwardly, the panel 60 is stopped, at a position somewhat above the region of delivery described in my aforementioned patent, in a set of two delivery stops 124, as best seen in FIGS. 21-24, that are provided on the loading position delivery belts 78. An electrical switch 123 is carried on an electrically insulating plate 127 that bridges the stops 124. Stops 124 desirably are adjustable to accommodate different lengths of panels 60. Such adjustment is in a plane that is displaced 10 degrees from the vertical plane and is such as to position the delivered laminated panel 60 at a height that is correct for the gripper bar 80 to make a proper attachment to the panel 60 at the upper end thereof.

When the panel 60 reaches the correct position for attachment to the gripper bar 80 and contacts switch 123, the gripper bar cylinders 90 are actuated and retract to move the gripper bar 80 to the left, as seen in FIG. 1, to contact the panel. When cylinders 90 make such contact, a reed switch 127 shown in FIG. 18 is closed and the gripper opening cylinders 122 retract to allow the individually spring loaded grippers 110, as seen in FIGS. 4 and 5, to secure the panel 60 in the grip thereof, thus completing the loading operation.

At this point in the cycle of operation, the loading position belts 78 are actuated to lower the delivery stops 124 down out of the way of the lower end of the panel 60. Simultaneously, the gripper bar loading cylinders 90 are actuated to the right, as seen in FIG. 1, to place the gripper bar 80 and the just loaded panel 60 in the magazine area 82 with the ends of the cylindrical rod 106 of the gripper bar 80 resting on opposed ledges 125, as indicated in FIGS. 1, 17 and 19. Subsequently, the gripper bar attaching claws 120 are opened and the gripper bar 80 and the attached panel 60 remain in the magazine area 82 as the gripper bar loading cylinders 90 are actuated for retraction fully to the left, as seen in FIG. 1.

In accordance with the invention, the gripper bar loading cylinders 90 have three distinct positions. The position all the way to the left, as seen in FIG. 1, is the loading position. The position fully extended to the right is the unload position. A center position is the pick up position where a laminated panel 60 is attached to the gripper bar 80.

As may be seen in FIG. 12, the gripper bars 80 are closely positioned in the storage area 82, each being in contact with the one next to it. With the magazine area fully loaded, when a gripper bar 80 is loaded and placed in the infeed end 84 of the magazine storage area 82, a simultaneous action occurs at the opposite or output end 86. Upon such occurrence, the 41st gripper bar 80 at the end 86 of the storage area 82 is forced out of the magazine storage area 82 into a carrier bucket 126 on the delivery chain 88. Simultaneoulsy, also, the delivery chain 88 is actuated and moved in a counterclockwise direction, as seen in FIG. 1, whereby the just received gripper bar 80 and depending panel 60 are moved on the bucket 126 that is carried by chain 88 toward the delivery end 128 of the buffer/interface unit 74.

Figure 14:
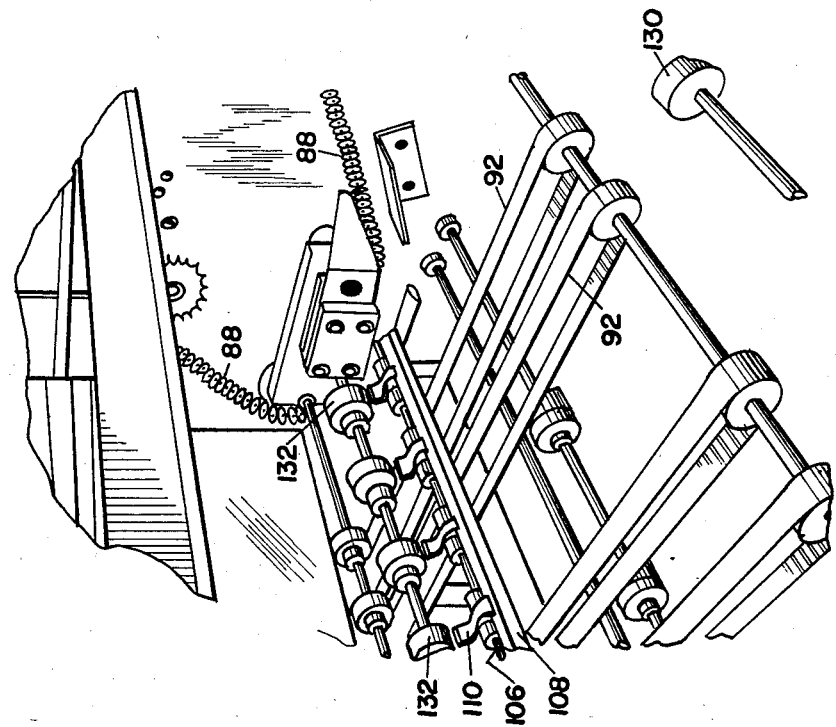
FIG. 14 is an angle view similar to that of FIG. 13 but shows grippers on the gripper bar just engaging a gripper release device.
Figure 13:
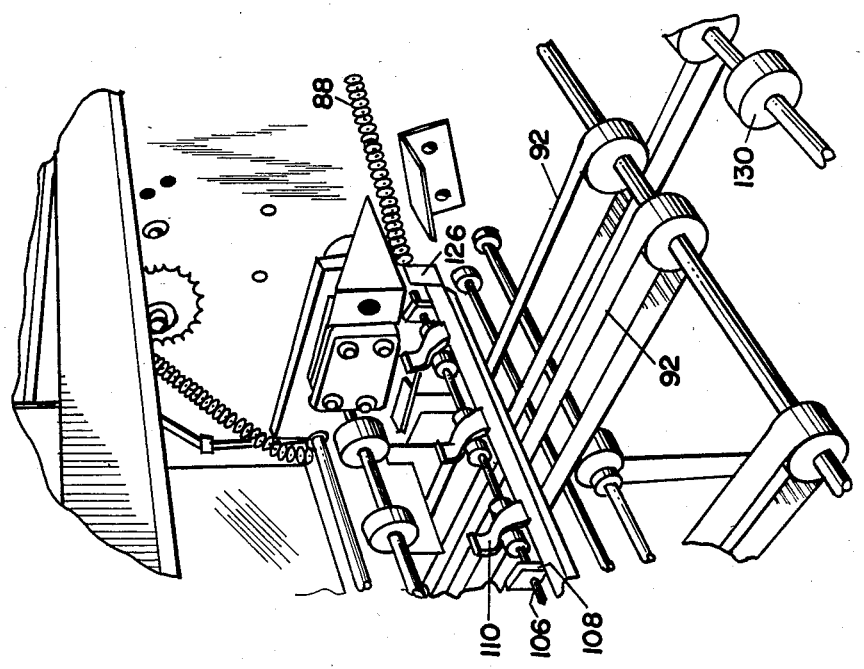
FIG. 13 is an angle view from the rear of the unit looking over the rear side frame of the delivery unit and shows the panel exit delivery belts and a gripper bar just entering the unloading area (no panel being shown)
Figure 15:
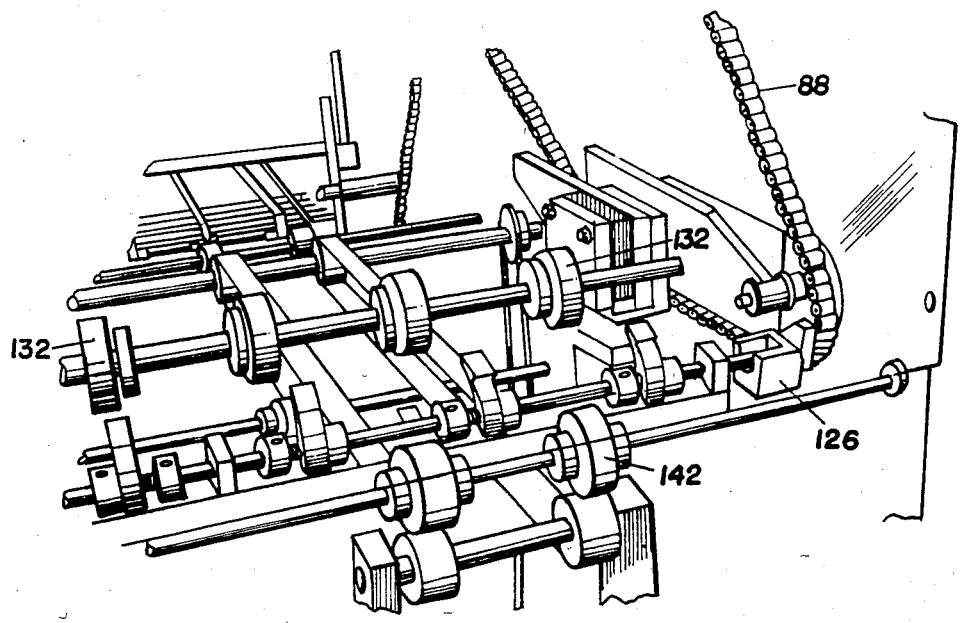
FIG. 15 is an angle view from the front of the delivery unit showing a gripper bar as just exiting the unload or gripper release point, and showing, in addition, pinch rolls on top of the panel exit delivery belts.
Figure 25:
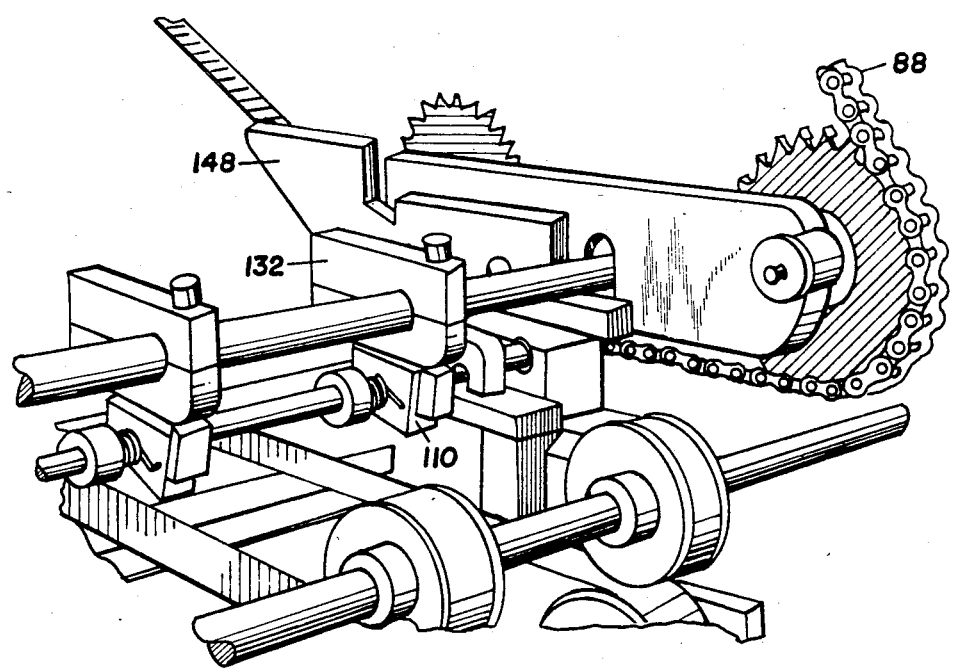
FIGS. 25 and 26 are angle views from the front of the buffer/interface unit, at the right side thereof and looking up at the delivery unit, showing the gripper release mechanism in greater detail.
Figure 26:
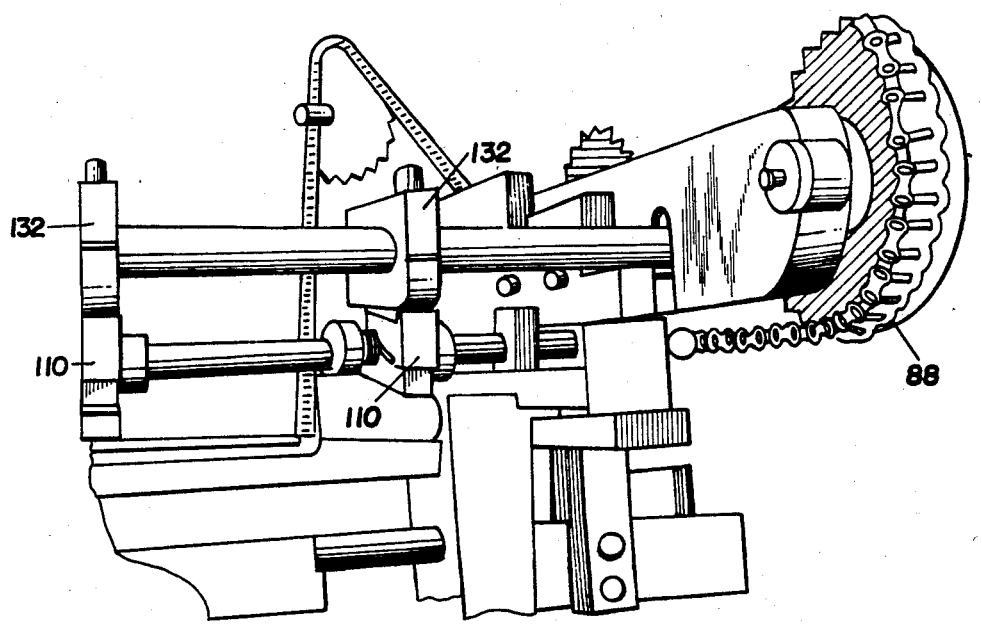

This action translates, that is, turns the panel 60 in a clockwise direction, as seen in FIG. 1., from the vertical position in which it has been held suspended by the gripper bar 80 in the magazine storage area 82, to a horizontal position, by way of idler rollers 130, and moves the panel 60 onto the delivery or panel exit belts 92. As the gripper bar 80 carried by chain 88 approaches and moves through the gripper bar release or opening devices 132, as seen in FIGS. 14, 25 and 26, the grippers 110 are opened and the panel 60 is thereby released and left on the delivery belts 92. Delivery belts 92 move the panel 60 between pinch rolls 142 through the delivery end 128 of unit 1 to a utilization means, for example, infeed table 94 of an associated exposure unit for imaging, as shown in FIG. 16.

Figure 27:
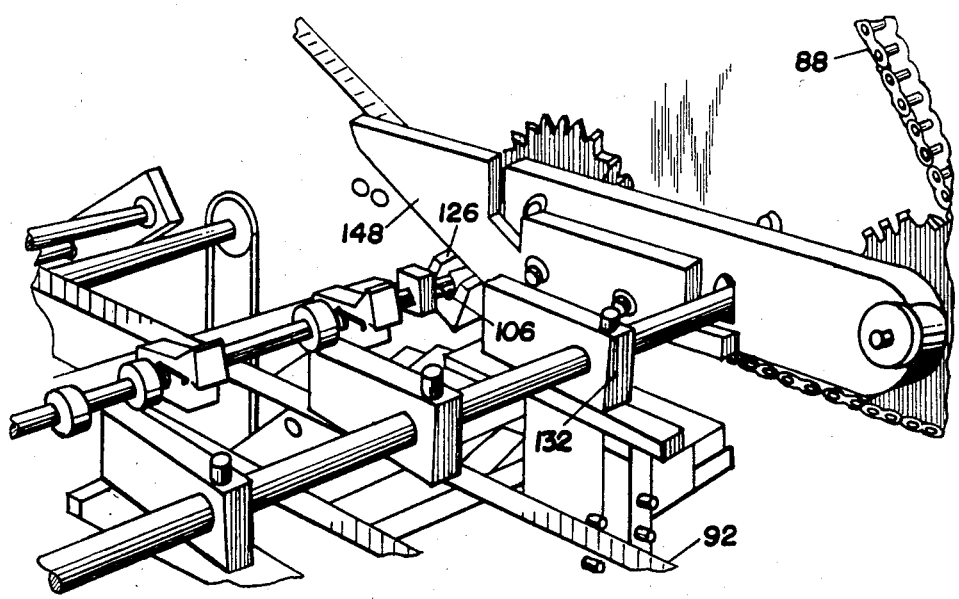
FIGS. 27 and 28 are additional angle views of the delivery unit from the right side of the buffer/interface unit looking over the front side of the frame.
Figure 28:
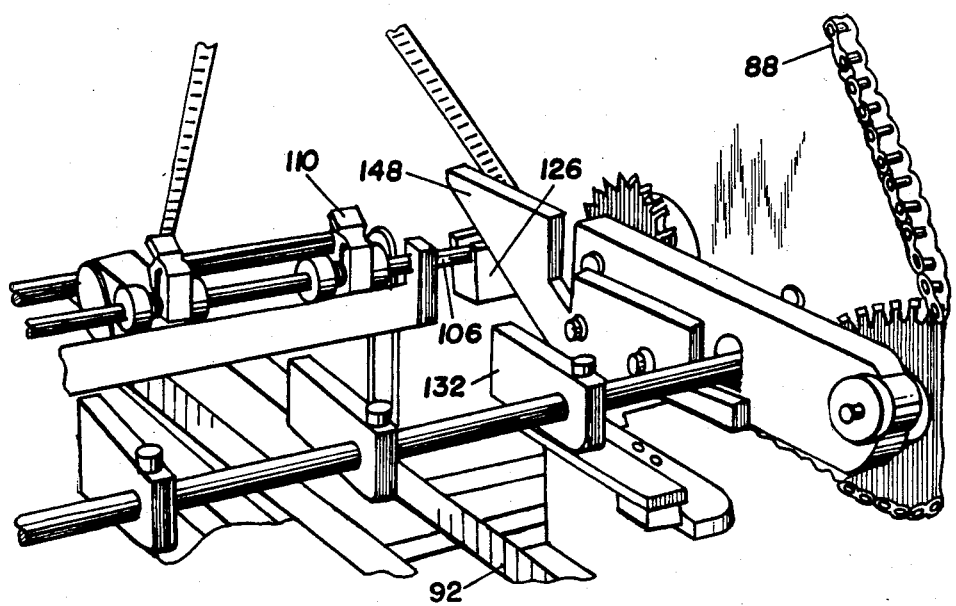

FIGS. 25-28 show the several positions into which the nylon grippers 110 are adjusted as a panel 60 carried thereby, but not shown for convenience of illustration, is translated from a suspended vertical position to a horizontal position on the delivery belts 92. Thus, FIG. 28 shows the grippers 110 as they are just beginning to be turned in a clockwise direction from the vertical position as a result of the engagement of the panel 60 with the idler rollers 130. FIG. 27 shows the grippers 110 in a horizontal position. In this position, the panel 60 (not shown) is trailing behind the grippers 110 still in the grip of the grippers 110.

FIGS. 27 and 28 show the carrier bucket 126 in engagement with a cam member 148 which together with a similar cam member on the opposite side of the buffer-/interface unit 74 serves to guide the carrier buckets 126 and gripper bars 80, and hence, the panel 60 down into receiving relation with the delivery belts 92.

FIGS. 25 and 26 show the grippers 110 as having been engaged by the gripper bar release devices 132, smooth cam surfaces on the bottom of the latter forcing the grippers 110 against the force of the biasing springs 114 to an open position for releasing the panel 60 on the delivery belts 92.

The gripper bar 80 movement with the delivery chain 92 continues to a position indicated at 136, above an idler roller sprocket 134, and marked with a bucket indication.

Position 136 is a hold position for the delivery chain 88. Since there are two carrier buckets 126 mounted on the delivery chain 88, this represents a 180 degree rotation of the chain 88. Such rotation brings the other bucket 126 into gripper bar and panel receiving position at the delivery loading or output portion 86 of the magazine area 82.

Figure 11:
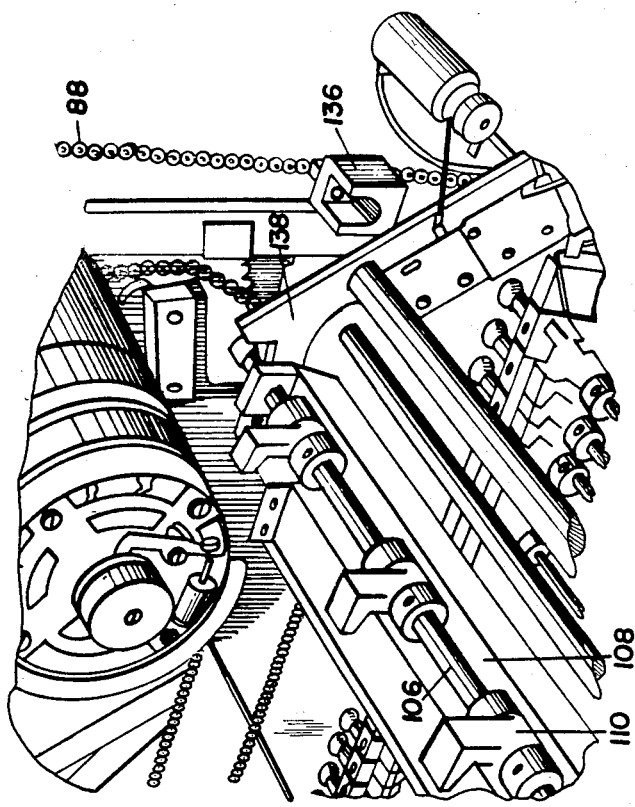
FIG. 11 is an angle view from the front of the unit looking over the front frame of the delivery unit and shows in greater detail the transfer arm of FIG. 10 in transfer position with a gripper bar resting in the return chain bucket.
Figure 10:
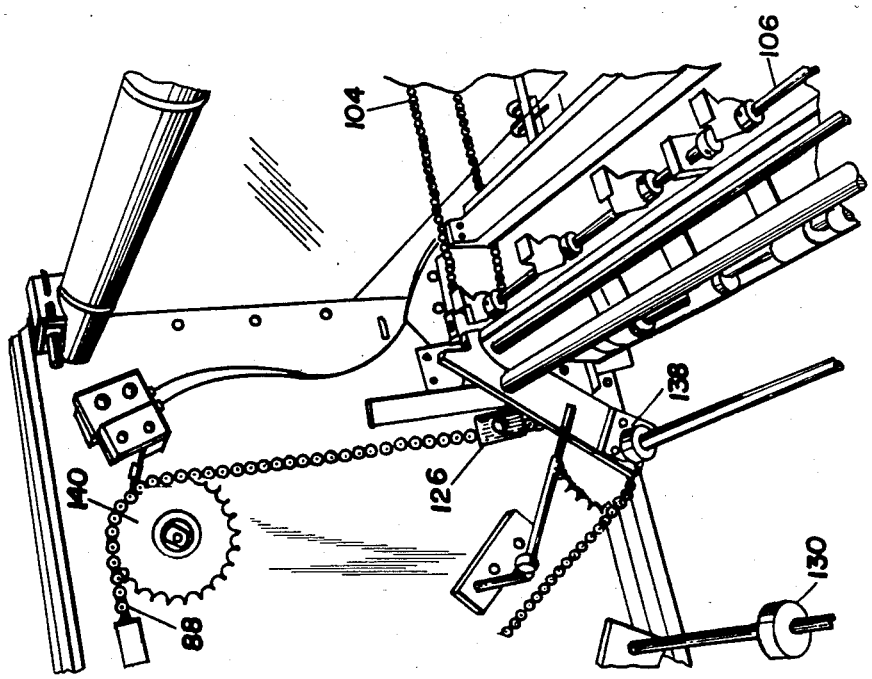
FIG. 10 is an angle view from the rear of the unit looking over the rear side frame of the delivery unit and shows a gripper bar return-to-chain transfer arm in the transfer position with a gripper bar resting in a return chain bucket.

The empty gripper bar 80, as it is moved back to the delivery loading portion 86 on chain 88, is intercepted by the plurality of gripper bar return-to-chain transfer arms 138, as best seen in FIGS. 1, 10 and 11. Transfer arms 138 are located just inside the pockets on the lower left hand side of the delivery chain 88, as shown in FIG. 1. As the gripper bar 80 is moved down from an idler sprocket 140 on the most upper left hand position on delivery 88, as seen in FIG. 1, the transfer arms 138 remove the gripper bar 80 from the delivery buckets 126, and being rotated counterclockwise approximately 30 degrees, serve to transfer the gripper bar 80 from the delivery chain 88 to carrier buckets 144 on the gripper bar return chain 104. This action immediately starts the return chain 104 for rotation in a counterclockwise direction. Chain 104 moves or cycles through 180 degrees and transfers the gripper bar 80 to the transfer-to-load transfer arms 96, allowing the gripper bar 80 to move down along a sloping surface of arm 96 into the pocket 102 of arm 96 while the latter is rotated to the gripper bar pick up position. The sensor switch 98 that indicates the gripper bar 80 as being in the pocket 102 is shown in FIGS. 2 and 3.

As previously mentioned, the buffer/interface according to the present invention may be controlled by the programmable controller provided in the automatic laminator 10, the latter having an expandable Input-/Output Rack which is capable of accommodating the additional circuitry that is needed.

Thus, in accordance with the invention, there has been provided an automatic laminator with integrated buffer/interface. The buffer/interface is operative to provide a holding area for the laminated panels for a suitable period, for example, up to fifteen minutes, in a suspended manner out of contact with each other and adjacent surfaces except for small grippers attached to an edge thereof. This holding period allows the laminated panels to stabilize chemically prior to imaging. The handling of the panels during the lamination process and also during the post lamination period is entirely automatic.

Having described the invention in detail, those skilled in the art will appreciate that modifications may be made to the invention without departing from the spirit thereof. Therefore, it is not intended that the scope of the invention be limited to the specific embodiment that is illustrated and described. Rather, it is intended for the scope of the invention to be determined by the appended claims.

What is claimed is:

1. In combination,
   an automatic laminator for laminating, in succession, each of a plurality of panels with photoresist dry film, and
   a buffer/interface unit for providing, in a post lamination period, a holding area for the laminated panels with the panels being held substantially vertically suspended in closely spaced relation to allow them to stabilize chemically prior to subsequent processing.

2. A combination as specified in claim 1 wherein said buffer/interface unit includes infeed and output portions and further includes means associated with the output portion thereof for translating each of said panels from the vertical to a horizontal position for subsequent processing.

3. A combination as specified in claim 2 further including an infeed table of exposure equipment to which said buffer/interface unit is mated, and
   means to deliver each of said panels in a horizontal position therof to said infeed table.

4. A combination as specified in claim 1 wherein said automatic laminator includes a delivery belt unit for delivering each of said laminated panels to said buffer/interface unit, and wherein said buffer/interface unit includes a plurality of gripper bars each of which is adapted for attachment to the upper edges of a panel,
   said buffer interface unit including an infeed portion and an output portion with said delivery belt unit including loading position belt means for positioning each of said panels, as delivered by said delivery belt unit, in proper position adjacent the infeed portion of the buffer/interface unit for the attachment at the upper edge thereof of a gripper bar, and
   said buffer/interface unit further including means for moving each of said gripper bars with an attached panel into the infeed portion thereof, such movement when the holding area of said buffer/interface unit is filled to capacity serving to force out of the output thereof the most advanced gripper bar and attached panel.

5. A combination as specified in claim 4 wherein said buffer/interface unit further includes means associated with the output thereof for translating each of said panels forced out of the output of the buffer/interface unit from the vertical to a horizontal postion and for effecting the release of the attached gripper bar.

6. A combination as specified in claim 5 wherein said means to translate each of said panels from the vertical to a horizontal position includes spaced rollers positioned in an upward slanted plane.

7. A combination as specified in claim 6 further including a horizontal panel exit delivery belt associated with the output of said buffer/interface unit, each of said panels when translated to the horizontal position being deposited on said panel exit delivery belt.

8. A combination as specified in claim 7 wherein each of said gripper bars includes a plurality of grippers each of which is spring biased to a closed position, and further including
   gripper opening cylinder means associated with the infeed portion of said buffer/interface unit to actuate each of said grippers to an open position for the attachment thereof to the upper edges of a panel, and
   cam means associated with the output of said buffer/interface unit to actuate each of said grippers to an open position to release the panel when translated to the horizontal position on the panel exit delivery belt.

9. A combination as specified in claim 8 wherein said means for moving each of said gripper bars with an attached panel into the infeed portion of said buffer interface unit comprises a gripper bar loading cylinder.

10. A combination as specified in claim 5 further including gripper bar return means to return each gripper bar to the infeed portion of said buffer/interface unit when released from a panel at the output thereof.

11. A combination as specified in claim 10 wherein said gripper bar return means includes a gripper bar return chain and a panel delivery chain, said chains cooperating to couple the infeed portion and output portion of the buffer/interface unit.

12. A combination as specified in claim 11 further including
    first carriet bucket means on said delivery chain into which a gripper bar with an attached panel is placed when forced out of the holding area of said buffer/interface unit,
    second carrier bucket means on said gripper bar return chain,
    gripper bar return-to-chain transfer arms, and
    gripper bar return-to-load transfer arms,
    said gripper bar return-to-chain transfer arms being operative to transfer said gripper bar from said first carrier bucket means to said second carrier bucket means, and
    said gripper bar return-to-load transfer arms being operative to transfer said gripper bar from said second bucket means to reloading position at the infeed portion of said buffer/interface unit.

13. A combination as specified in claim 12 wherein each of said gripper bar return-to-chain transfer arms and gripper bar return-to-load transfer arms includes a pocket that is adapted to receive and to hold said gripper bar during the transfer function thereof, said gripper bar return-to-load transfer arm including an inclined portion along which each of said gripper bars is guided for movement into the pocket thereof.

14. A buffer/interface unit for providing, in a post lamination period, for panels laminated with photoresist dry film a holding area to allow the panels to stabilize chemically prior to further processing, said buffer interface unit being automatically operative to accept, in succession, a plurality of laminated panels from an associated laminator and to hold them vertically suspended in closely spaced relation in the holding area during a post lamination period and thereafter to discharge said panels.

15. A buffer/interface unit as specified in claim 14 further including means operative upon the discharge of each of said panels from the holding area to translate each of the panels from the vertical to a horizontal position for further processing.

* * * * *